Oct. 9, 1962 G. SCHWEITZER Re. 25,256
OSCILLATOR HAVING VOLTAGE-SENSITIVE TUNING CAPACITOR BIASED BY OSCILLATOR GRID SELF-BIAS AND EXTERNAL SIGNAL
Original Filed April 20, 1959
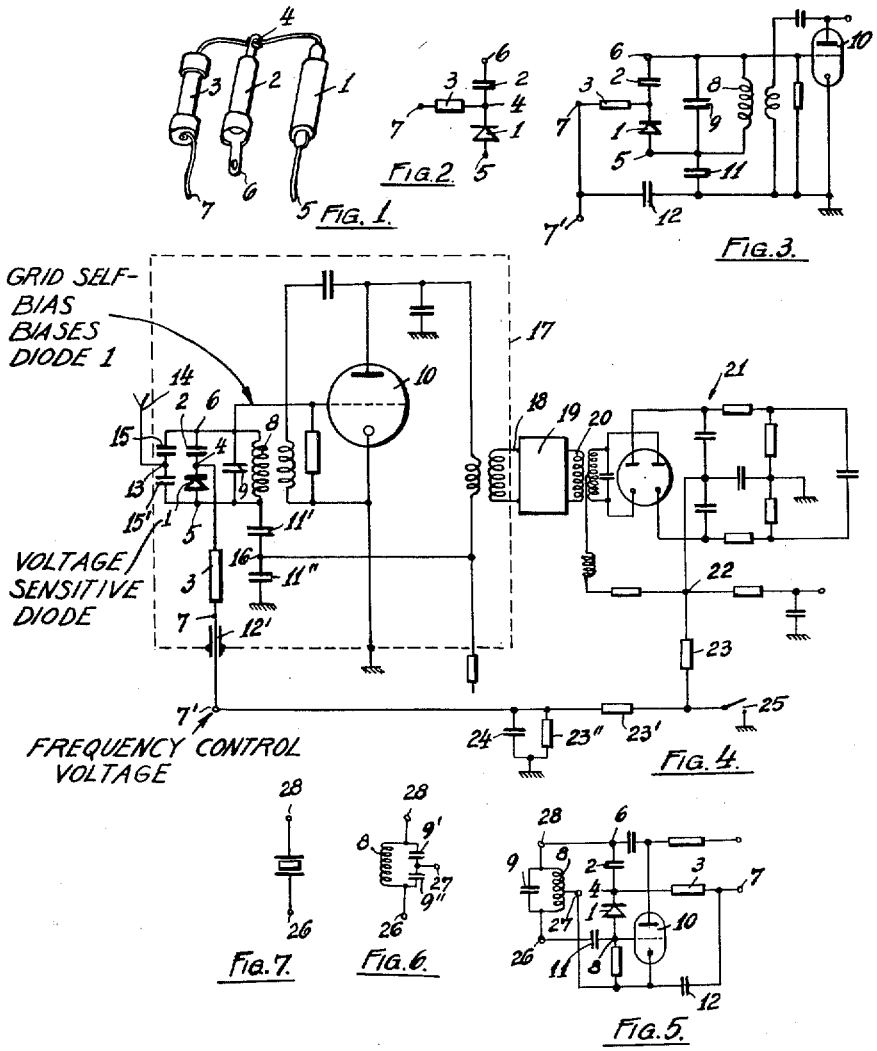
INVENTOR.
GERHARD SCHWEITZER
BY Brumbaugh, Free, Graves & Donohue
HIS ATTORNEYS United States Patent Office Re. 25,256
Reissued Oct. 9, 1962

25,256

OSCILLATOR HAVING VOLTAGE-SENSITIVE TUNING CAPACITOR BIASED BY OSCILLATOR GRID SELF-BIAS AND EXTERNAL SIGNAL

Gerhard Schweitzer, Mannheim-Rheinau, Germany, assignor to Regina Mangold, née Gorler, and Horst Gorler, trading as Julius Karl Goerler Transformatorenfabrik, Berlin-Reinickendorf, Germany, a firm Original No. 2,936,428, dated May 10, 1960, Ser. No. 807,366, Apr. 20, 1959. Application for reissue Apr. 12, 1962, Ser. No. 188,923
Claims priority, application Germany May 8, 1958
9 Claims. (Cl. 331—177)

Matter enclosed in heavy brackets [ ] appears in the original patent but forms no part of this reissue specification; matter printed in italics indicates the additions made by reissue.

The invention concerns a circuit arrangement for the automatic tuning of oscillators for frequency modulation receivers by means of a simi-conductor diode influencing the frequency of the oscillator [tank] *tuned* circuit and acting as a voltage dependent capacity [,]. *The diode is* preferably a silicon diode which is connected with decoupling components via which the diode is supplied [substantially] with *an essentially constant voltage of such polarity that the diode is biased in the reverse direction* [a constant cut-off voltage] and at the same time with a frequency determining variable control voltage. The invention consists in the fact that the rectified oscillating voltage of the oscillator is applied to the semi-conductor diode as a [blocking auxiliary] *reverse bias* voltage.

*In practice, it* [It] is convenient [in this case] for *one side of* the diode to be connected [on the one hand by avoiding additional potential dividers, eliminators, coupling and decoupling means for supplying the cut-out voltage] directly with a point of the oscillatory circuit simultaneously carrying a grid and oscillating voltage potential, for example, the control grid of the oscillator tube, and [on the other hand] *for the other side of the diode to be connected (1)* via a coupling capacitor which is of small capacity compared with the diode capacity to a further point of the oscillatory circuit showing a different oscillating voltage potential, for example, to the anode end of the oscillator [tank] *tuned* circuit, and *(2)* via a decoupling resistor with the control voltage source for the purpose of supplying the control voltage determining the frequency.

It may also be an advantage for the connections to be [so varied] *such* that one [tank] *end of the tuned* circuit is directly connected to the grid of the oscillator tube, *the connections being of a character* wherein the charging capacitor for the grid detection may be connected between a point of the [tank] *tuned* circuit and ground, [whereby] *and wherein, further,* the semi-conductor diode [on the one hand] and the [remote end of the] small coupling capacitor connected in series therewith *are elements forming a series combination which* [on the other hand] is connected in parallel with the [tank] *tuned* circuit [of] *which carries* the rectified alternating current potential [carrying the potential].

It is known to couple semi-conductor diodes to the [tank] *tuned* circuit of oscillators in frequency modulation receivers and [to supply to them] *(*via high frequency [coupling] *decoupling* components *connected to both sides of the diode in question) to supply to one side of such a diode a reverse biasing* [arranged on either side of the one hand a positive cut-out auxiliary] voltage originating from a separate voltage divider or the cathode of an amplifying stage, and *to supply to the other side of such diode* [on the other hand] the frequency determining control voltage. Thus, *in such prior art practice,* the terminal corresponding to the cathode of the diode is connected via a coupling capacitor with the grid of the oscillator tube and the other terminal of the diode with ground via a blocking capacitor. The terminal of the semi-conductor diode corresponding to the cathode is supplied from the cathode of the first intermediate frequency amplifying tube via a high frequency choke with a positive [cut-out] *reverse biasing* voltage of about 1.5 volts. *At the same time,* [and] to the terminal of the diode corresponding to the anode, *there is* supplied from the discriminator or ratio detector of the receiver *(*via low frequency suppressing RC filter sections*)* a control voltage depending upon the detuning of the central frequency. For coupling the diode to the oscillator and *for supplying the reverse bias voltage and the* [to the high frequency coupling supply of cut-off and] control voltage there are required [herein] *in such known arrangement* four units in all, namely a resistor, a choke and two capacitors.

[Besides] *To mention another common way for obtaining the reverse bias voltage for the diode* the production of *such* a diode voltage [in] *by* a specially provided voltage divider is already known but involves further structural units and filter means.

[On the other hand] *In contrast,* the invention allows the diode to be inserted in the circuit by means of two structural elements only [, wherein] *and in such a manner that* the grid direct current voltage of the oscillator is used as a [cut-off] *reverse bias* voltage, thereby avoiding a separate source of voltage or a separate voltage divider, [which produces the cut-off voltage] *to produce a reverse biasing voltage for the diode* from the anode voltage source. Besides a reduction of expenditure [there], *another advantage of the invention* is a noticeable saving of space [also] achieved [by this] in [the] *compactly* [narrowly] constructed [ultra short wave] tuning units, since the choke is omitted.

The invention will be described further, by way of example, with reference to the accompanying drawings, in which:

FIG. 1 is a perspective view of the tuning device adapted to be inserted and comprising a silicon diode, the decoupling resistor and coupling block capacitor;

FIG. 2 is a circuit diagram of the tuning device according to FIG. 1;

FIG. 3 is a circuit diagram of an oscillator having a tuning device inserted therein;

FIG. 4 is a circuit diagram of a self-executed neutralized conversion detector of a tuning unit in a frequency modulation receiving set;

FIG. 5 is a circuit diagram of a three point oscillator having a tuning device inserted therein; and FIGS. 5 and 6 are variations for the arrangement according to FIG. 5.

FIGS. 1 and 2 show the connection or assembly of the tuning devices suitable for incorporation in conventional oscillators and comprising a silicon diode 1, a coupling capacitor 2 and a decoupling resistor 3, wherein the three circuit elements 1, 2, 3 on the one side are unilaterally interconnected in the neutral point 4 and on the other side have free terminal ends 5, 6, 7.

In accordance with experience, semi-conductors, especially silicon diodes, have substantially different self-capacity. The [dispersal] *variation in* range caused thereby of the capacity appearing between the terminals 5 and 6 of the tuning device is considerably restricted by the selection of a coupling condenser small even in comparison with that of the smallest possible diode capacity (approx. 1 *micromicrofarad* [pf.]), so that during production the given diode capacity need not be taken into consideration.

FIG. 3 shows the tuning device inserted in a Meissner oscillator. The terminals 5 and 6 herein are connected in parallel to the [tank] *tuned* circuit formed by the coil 8 and the capacitor 9 [, which]. *That tuned circuit* with one of its ends is directly connected with the grid of the oscillator tube 10, so that it carries the direct current grid voltage and transmits the *same* [latter] to the diode as [cut-off voltage] *reverse bias voltage in the sense that such grid voltage is manifested across capacitor 11 and at the anode terminal 5 of the diode 1 as a negative voltage with respect to ground.* The capacitor [10] *11* on the one hand serves as ground capacitor for the other [tank] *tuned* circuit end, and on the other hand acts as charging capacitor during rectification at the grid of the oscillator tube 10. The capacitor 12 provides the high and possibly intermediate frequency grounding of the terminal point 7 or 7′, via which the control voltage for the actuation of the tuning device is supplied from the outside *in, say, the manner shown by FIG. 4. As indicated by FIG. 4 the cathode terminal of diode 1 is connected through elements 3, 7, 7′, and 23″ to ground. Hence in the view that the self bias voltage developed from grid current rectification by the FIG. 3 circuits is manifested therein at the diode cathode terminal 5 as a negative voltage with respect to ground, such self-bias voltage is applied to diode 1 as a reverse bias voltage therefor.*

FIG. 4 shows a modified Meissner oscillating circuit of FIG. 3, which [by including] *includes* the condensers 15, 15′ [forming an oscillating circuit tapping] *connected in series to provide by the junction therebetween a capacitive tap* 13 for connecting an antenna 14 or [capacitors 15, 15′ of] a previous *R.F.* stage [into the tank circuit 8, 9 and by dividing] *to the FIG. 4 circuit. In that FIG. 4 circuit,* the grid charging capacitor is divided into the the two capacitors 11′ and 11″, *the* shown [and] connection of the *junction 16 between capacitors 11 and 11′* [connecting point 16 thereof] to the anode of the oscillator tube [is extended to a self-oscillating conversion detector] *being a connection which serves to extend the circuit in such a way that the self-oscillating detector circuit which is shown by FIG. 4 is* neutralized with regard to the antenna point 13.

This oscillator mixing stage *which (if necessary) is preceded by* [if necessary inclusive] a high frequency preamplifying stage (not shown), forms a tuning unit and is accommodated in a screening housing 17, through which the connecting leads are passed possibly via lead-in capacities 12′. The intermediate frequency output 18 of the tuning unit is connected with a diagrammatically shown intermediate frequency amplifier 19 the output 20 of which feeds a ratio detector 21. The direct current voltage component occurring at the *audio terminal 22 of the ratio detector is* [low frequency output 22 thereof] dependent upon the detuning of the central frequency of the signal received relative to the central frequency of the ratio detector 21 and is supplied as tuning control voltage via a RC filter section 23, 23′, 23″, 24, 12′ to the point 7 of the tuning device 1, 2, 3. This control voltage may be switched off by means of the switch 25.

FIG. 5 shows a three point Hartley oscillator circuit in which the tuning device is so inserted that the diode terminal 5 is in direct connection with the control grid of the oscillator tube 10 and the capacitor terminal 6 with the anode end of the [tank] *tuned* circuit 8, 9. Similarly it is also possible for *the tuning device to be employed with* other oscillation circuits [to be carried out] *(*for example, a Colpitts or a Pierce circuit*)* in *which* [that a] potential division is used. For this purpose it is possible to use in accordance with FIG. 6 a capacitively tapped *tuned* [tank] circuit between the terminals 26, 27 and 28 in place of an inductively tapped *tuned* [tank] circuit 8, 9, [in which the tank] *the tuned* circuit capacity *being* [is] divided into two condensers 9′, 9″ connected in series [, or]. *Further,* it is possible in accordance with FIG. 7 to insert a piezoelectric resonator between the terminals 26 and 28, whereby the capacitive potential division is effected via the inner tube capacities and the tuning range being substantially smaller than in the case of oscillators operating with [the normal tank] *conventional tuned* circuits.

I claim:

1. In a frequency modulation receiver circuit, an oscillator *tuned* [tank] circuit, an arrangement for automatic oscillator tuning comprising a semi-conductor diode such as a silicon diode adapted to act as a potential dependent capacity influencing the frequency of the oscillator *tuned* [tank] circuit, decoupling components connected to said diode, [means for supplying by way of said decoupling components a substantially constant cut-off voltage to said diode,] means for supplying by way of said decoupling components a frequency determining variable control voltage to said diode, means for rectifying the oscillator output, and means for applying *by way of said decoupling components* the rectified oscillator output as a *reverse biasing* [suppressing auxiliary] voltage to said diode.

2. *Apparatus* [An arrangement] as defined in claim 1 *in which said oscillator circuit is comprised of a tuned circuit and an oscillator tube having a grid, and in which said rectifying means comprises means to produce a grid potential as a self bias voltage for said oscillator circuit from current rectified by means of said grid, said apparatus* including means for connecting the diode directly with one point of the [tank] *tuned* circuit carrying the grid and oscillating potential, a capacitor having a capacity which is small relative to the diode capacity, means for connecting the diode by way of said capacitor to another point of the [tank] *tuned* circuit having a different oscillating potential, a control voltage source, a decoupling means, and means for connecting said diode to said control voltage source by way of said decoupling means.

3. *Apparatus* [An arrangement] as defined in claim 1 *in which said oscillator circuit is comprised of a tuned circuit and an oscillator tube having a grid and in which said rectifying means comprises means to produce a grid potential as a self bias voltage for said oscillator circuit from current rectified by means of said grid, said apparatus* including means for connecting the diode directly with one point of the [tank] *tuned* circuit carrying the grid and oscillating potential, a capacitor having a capacity which is small relative to the diode capacity, means for connecting the diode by way of said capacitor to ground, a control voltage source, a decoupling means, and means for connecting said diode to said control voltage source by way of said decoupling means.

4. An arrangement as defined in claim 1, including an oscillator tube having a grid, means for connecting a point on the [tank] *tuned* circuit directly to said grid, a capacitor for grid rectification, means for connecting said grid rectification capacitor between a point of the [tank] *tuned* circuit and ground, a coupling capacitor having a small capacity relative to the diode capacity, and means for connecting the diode in series with said small capacitor across the [tank] *tuned* circuit.

5. In a frequency modulation receiver circuit, a semiconductor diode such as a silicon diode having an anode and a cathode, means for adjusting the capacity of said diode by a control voltage, a capacitor having two poles, a resistor having two ends, means for electrically connecting together one pole of the capacitor, one end of the resistor and the cathode of the diode, means for connecting the anode of the diode to one point of the oscillator which simultaneously carries the oscillating voltage and the direct current grid voltage originating from grid detection, means for connecting the other pole of the capacitor to a point of the oscillator which carries a substantially different oscillating potential, and means for connecting the other end of the resistor to a point carrying a frequency determining variable control voltage.

6. *Apparatus comprising, an oscillator circuit, a semiconductor device having a voltage dependent capacity and connected in said circuit to control the frequency of the oscillations thereof as a function of said capacity,*

*means to rectify some of the oscillatory energy of said circuit and to derive from said rectified energy a direct current potential, means to apply to said device a biasing voltage developed from said potential, and means to apply to said device a variable voltage for determining said capacity thereof and, thereby, the frequency of said oscillations.*

*7. Apparatus comprising, an oscillator circuit, a semiconductor diode having a voltage dependent capacity and connected in said circuit to control the frequency of the oscillations thereof as a function of said capacity, means to derive from said oscillations a self-biasing direct current potential for said circuit, means to apply to said diode a reverse biasing voltage developed from said potential, and means to apply to said diode a variable voltage for determining said capacity thereof and, thereby, the frequency of said oscillations.*

*8. Apparatus comprising, an oscillator circuit, a semiconductor diode having a voltage dependent capacity and connected in said circuit to control the frequency of the oscillations thereof as a function of said capacity, means including a capacitor to derive from said oscillations and for said circuit a self-biasing voltage of which at least a portion is manifested as a direct-current potential between the opposite sides of said capacitor, direct current conductive paths connecting the opposite sides of said capacitor to, respectively, the cathode and anode of said diode so as to develop on said diode from said potential a reverse biasing voltage, and means to apply to said diode a variable voltage for determining said capacity thereof and, thereby, the frequency of said oscillations.*

*9. Apparatus comprising, an oscillator circuit including a tuned circuit, a semiconductor diode having a voltage dependent capacity, means including a capacitor to derive from the oscillations of said oscillator circuit a voltage which self-biases such circuit, and of which at least a portion is manifested as a direct-current potential across said capacitor, direct current conductive paths connecting the opposite sides of said capacitor to, respectively, the cathode and anode of said diode so as to develop on said diode from said potential a reverse biasing voltage, capacitance means connecting said diode to said tuned circuit so as to render the frequency of said oscillations controlled as a function of the voltage dependent capacity of said diode, but so as to block flow of direct current through said tuned circuit between the cathode and anode of said diode, and means to apply to said diode a variable voltage adapted by varying the voltage dependent capacity of said diode to vary the frequency of said oscillations.*

References Cited in the file of this patent or the original patent

UNITED STATES PATENTS

| | | |
|---|---|---|
| 2,243,921 | Rust | June 3, 1941 |
| 2,708,739 | Bucher | May 17, 1955 |
| 2,841,711 | Kock | July 1, 1958 |
| 2,936,428 | Schweitzer | May 10, 1960 |